(12) United States Patent
Sasaki et al.

(10) Patent No.: US 10,972,060 B2
(45) Date of Patent: Apr. 6, 2021

(54) RADIO FREQUENCY POWER AMPLIFIER AND POWER AMPLIFIER MODULE

(71) Applicant: Murata Manufacturing Co., Ltd., Kyoto-fu (JP)

(72) Inventors: Kenji Sasaki, Nagaokakyo (JP); Isao Obu, Nagaokakyo (JP); Takayuki Tsutsui, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 32 days.

(21) Appl. No.: 16/569,271

(22) Filed: Sep. 12, 2019

(65) Prior Publication Data

US 2020/0091874 A1    Mar. 19, 2020

(30) Foreign Application Priority Data

Sep. 14, 2018 (JP) ............................. JP2018-172851
Jul. 1, 2019 (JP) ............................. JP2019-122978

(51) Int. Cl.
*H03F 3/191* (2006.01)
*H03F 3/19* (2006.01)
*H03F 1/30* (2006.01)
*H03F 3/213* (2006.01)

(52) U.S. Cl.
CPC .............. *H03F 3/19* (2013.01); *H03F 1/302* (2013.01); *H03F 3/213* (2013.01); *H03F 2200/451* (2013.01)

(58) Field of Classification Search
CPC ........................................................ H03F 3/191
USPC ................................................. 330/302, 296
See application file for complete search history.

(56) References Cited

U.S. PATENT DOCUMENTS 10,439,563 B2 * 10/2019 Takagi .................... H03F 3/195
2002/0044017 A1    4/2002 Suzuki et al.

FOREIGN PATENT DOCUMENTS

| JP | 2001-274636 A | 10/2001 |
| JP | 2002-217378 A | 8/2002 |
| TW | 544726 B | 8/2003 |

* cited by examiner

*Primary Examiner* — Henry Choe
(74) *Attorney, Agent, or Firm* — Studebaker & Brackett PC

(57) ABSTRACT

In a radio frequency power amplifier, a semiconductor chip includes at least one first transistor amplifying a radio frequency signal, a first external-connection conductive member connected to the first transistor, a bias circuit including a second transistor that applies a bias voltage to the first transistor, and a second external-connection conductive member connected to the second transistor. The second external-connection conductive member at least partially overlaps with the second transistor when viewed in plan.

20 Claims, 13 Drawing Sheets

RADIO FREQUENCY POWER AMPLIFIER AND POWER AMPLIFIER MODULE

CROSS-REFERENCE TO RELATED APPLICATIONS

This application claims benefit of priority to Japanese Patent Application No. 2018-172851, filed Sep. 14, 2018, and to Japanese Patent Application No. 2019-122978, filed Jul. 1, 2019, the entire content of each is incorporated herein by reference.

BACKGROUND

Technical Field

The present disclosure relates to a radio frequency power amplifier and a power amplifier module.

Background Art

A hetero-junction bipolar transistor is used in a radio frequency power amplifier for a mobile terminal, etc. Each of Japanese Unexamined Patent Application Publication No. 2001-274636 and No. 2002-217378 discloses a radio frequency power amplifier in which a temperature-compensated base bias potential is supplied to a hetero-junction bipolar transistor in an amplifier circuit.

In a base bias circuit of the radio frequency power amplifier disclosed in Japanese Unexamined Patent Application Publication No. 2001-274636, a diode-connected transistor for temperature detection is disposed near a bipolar transistor for amplification. A base bias circuit of the radio frequency power amplifier disclosed in Japanese Unexamined Patent Application Publication No. 2002-217378 includes a bias voltage reducing portion that reduces a bias voltage depending on a temperature rise of the bipolar transistor in a radio frequency amplifier portion. The bias voltage reducing portion includes a diode, and a cathode of the diode is thermally coupled to a metal wiring that is connected to an emitter of the bipolar transistor in the radio frequency amplifier portion.

Thermal stability of the hetero-junction bipolar transistor is increased by disposing an element, such as a temperature detection diode, near the hetero-junction bipolar transistor. According to the simulation conducted by the inventors of this application, however, it has been found that, with a configuration of just disposing a temperature detection element near the hetero-junction bipolar transistor for amplification, thermal stability of operation of the radio frequency power amplifier is not sufficient in some cases. The reason presumably resides in that, because an emitter-follower transistor (drive transistor) in the base bias circuit is affected by heat generated from an amplifier circuit, hFE of the drive transistor lowers and the current supply ability reduces.

SUMMARY

Accordingly, the present disclosure provides a radio frequency power amplifier which can suppress reduction of thermal stability of operation even with a temperature rise of a hetero-junction bipolar transistor for amplification. The present disclosure also provides a power amplifier module including the radio frequency power amplifier.

According to one preferred embodiment of the present disclosure, a radio frequency power amplifier includes a semiconductor chip. The semiconductor chip includes at least one first transistor formed on or in a substrate and amplifying a radio frequency signal, a first external-connection conductive member connected to the first transistor, a bias circuit including a second transistor that applies a bias voltage to the first transistor, and a second external-connection conductive member connected to the second transistor. The second external-connection conductive member at least partially overlaps with the second transistor when viewed in plan.

According to another preferred embodiment of the present disclosure, a power amplifier module includes a semiconductor chip and a module substrate onto which the semiconductor chip is mounted. The semiconductor chip includes at least one first transistor amplifying a radio frequency signal, a first external-connection conductive member connected to the first transistor, a bias circuit including a second transistor that applies a bias voltage to the first transistor, and a second external-connection conductive member connected to the second transistor. The second external-connection conductive member at least partially overlaps with the second transistor when viewed in plan. Also, the module substrate includes a dielectric portion made of a dielectric material, a first land and a second land that are opposed respectively to the first external-connection conductive member and the second external-connection conductive member and that are connected respectively to the first external-connection conductive member and the second external-connection conductive member, and a conductor pattern disposed as an inner layer in the dielectric portion, connected to the second land, and having a size and a shape containing a contour of the second land when viewed in plan.

Since the second transistor and the second external-connection conductive member are disposed to partially overlap with each other when viewed in plan, heat dissipation characteristics from the second transistor are improved. As a result, a temperature rise of the second transistor can be suppressed, and reduction of thermal stability in operation of the radio frequency power amplifier can be suppressed.

Other features, elements, characteristics and advantages of the present disclosure will become more apparent from the following detailed description of preferred embodiments of the present disclosure with reference to the attached drawings.

DETAILED DESCRIPTION

First Embodiment

A radio frequency power amplifier according to a first embodiment will be described with reference to FIGS. 1 to 6.

Figure 1:
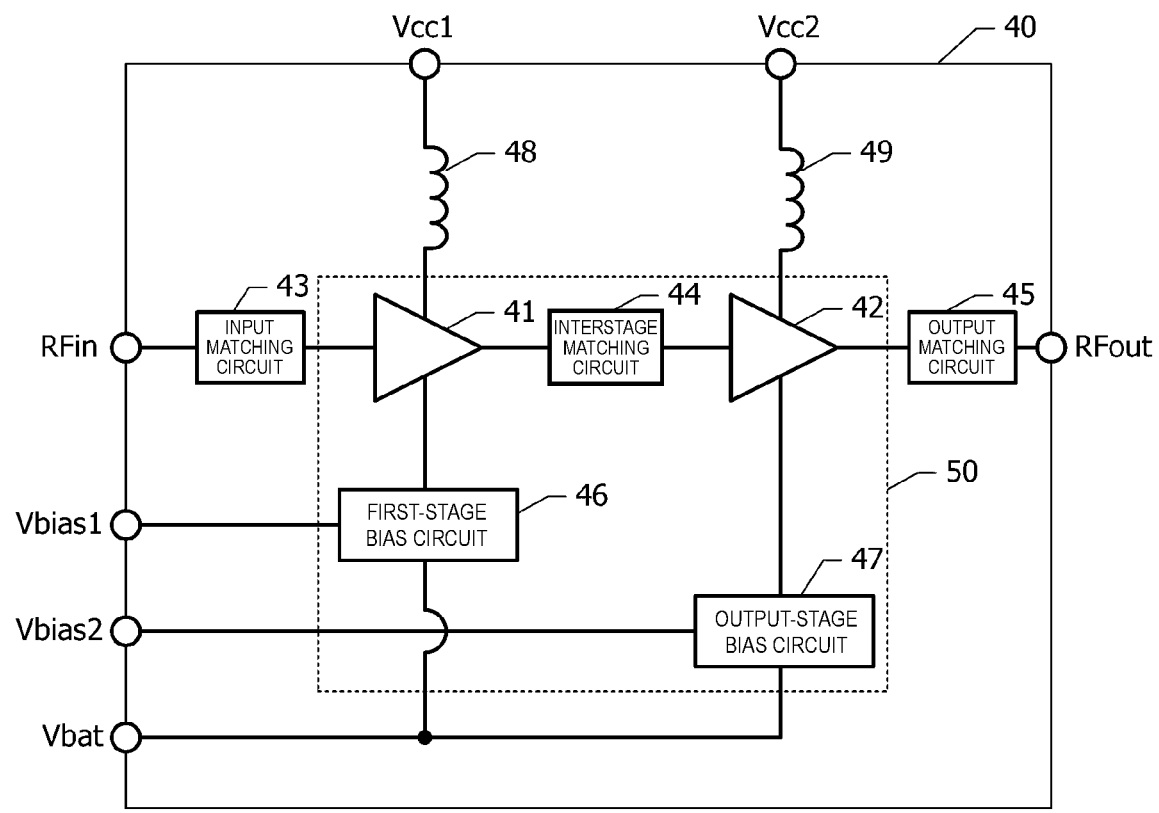
FIG. 1 is a block diagram of a radio frequency power amplifier according to a first embodiment.

FIG. 1 is a block diagram of the radio frequency power amplifier, denoted by 40, according to the first embodiment. An input signal applied from a radio frequency signal input terminal RFin is input to a first-stage amplifier circuit 41 through an input matching circuit 43. A signal amplified by the first-stage amplifier circuit 41 is input to an output-stage amplifier circuit 42 through an interstage matching circuit 44. A signal amplified by the output-stage amplifier circuit 42 is output from a radio frequency signal output terminal RFout through an output matching circuit 45.

A power-supply voltage for biasing is supplied to a first-stage bias circuit 46 and an output-stage bias circuit 47 from a bias voltage input terminal Vbat. The first-stage bias circuit 46 supplies a bias voltage to the first-stage amplifier circuit 41 in accordance with a bias control signal input from a first-stage bias control terminal Vbias1. The output-stage bias circuit 47 supplies a bias voltage to the output-stage amplifier circuit 42 in accordance with a bias control signal input from an output-stage bias control terminal Vbias2. A power-supply voltage is applied to the first-stage amplifier circuit 41 from a power-supply voltage supply terminal Vcc1 for the first-stage amplifier circuit through an inductor 48. A power-supply voltage is applied to the output-stage amplifier circuit 42 from a power-supply voltage supply terminal Vcc2 for the output-stage amplifier circuit through an inductor 49.

The first-stage amplifier circuit 41, the interstage matching circuit 44, the output-stage amplifier circuit 42, the first-stage bias circuit 46, and the output-stage bias circuit 47 are incorporated into one semiconductor chip 50. The input matching circuit 43, the output matching circuit 45, and the inductors 48 and 49 are disposed on a module substrate onto which the semiconductor chip 50 is mounted. Various input and output terminals of the semiconductor chip 50 are constituted by pads disposed on an upper surface of the semiconductor chip 50 and bumps on the pads. While the input matching circuit 43 and the output matching circuit 45 are disposed on the module substrate in the first embodiment, the entirety or part of the input matching circuit 43 and the output matching circuit 45 may be incorporated into the semiconductor chip 50.

Figure 2:
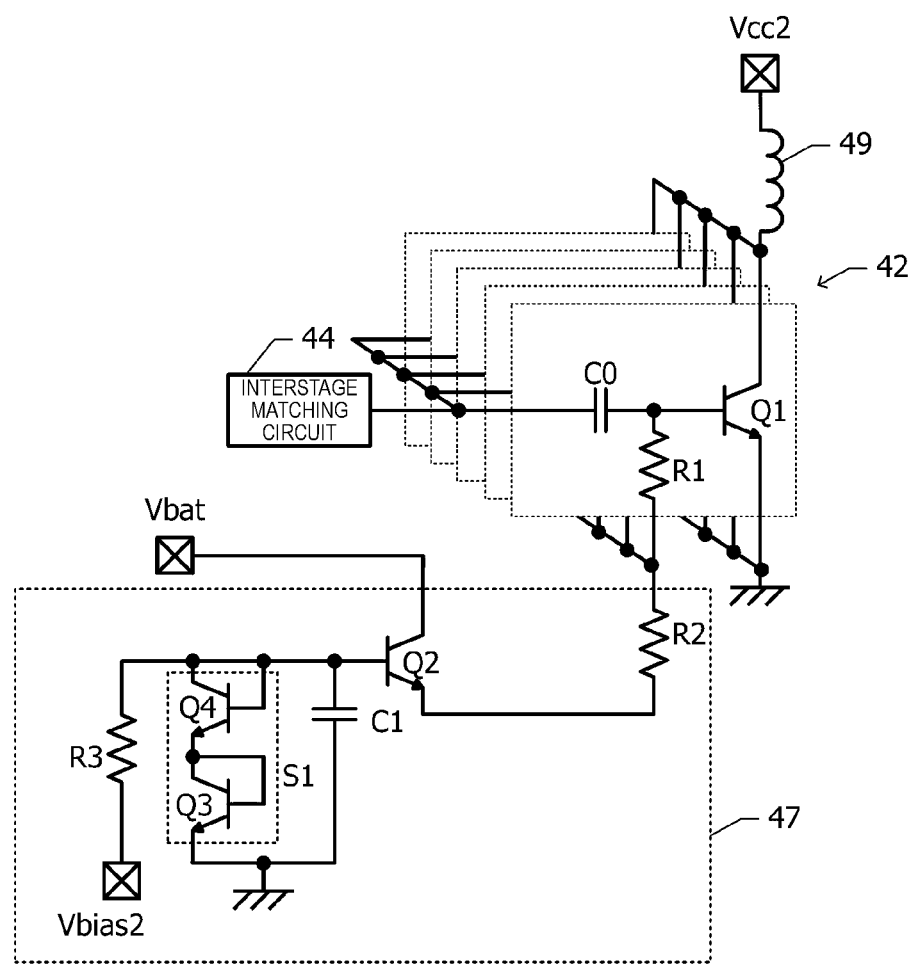
FIG. 2 is an equivalent circuit diagram of an output-stage amplifier circuit and an output-stage bias circuit (FIG. 1)

FIG. 2 is an equivalent circuit diagram of the output-stage amplifier circuit 42 and the output-stage bias circuit 47 (FIG. 1). Basic circuit configurations of the first-stage amplifier circuit 41 and the first-stage bias circuit 46 are similar to those of the output-stage amplifier circuit 42 and the output-stage bias circuit 47, and hence they are not described here.

A first transistor Q1 for amplification, a DC cut capacitance C0, and a base ballast resistance R1 constitute one basic cell. The DC cut capacitance C0 and the base ballast resistance R1 are both connected to a base of the first transistor Q1. The output-stage amplifier circuit 42 includes a plurality (e.g., 16) of basic cells connected in parallel. Each first transistor Q1 is a hetero-junction bipolar transistor. A radio frequency signal is input to the base of each first transistor Q1 from the interstage matching circuit 44 through the DC cut capacitance C0. A base bias voltage is supplied to the base of each first transistor Q1 from the output-stage bias circuit 47 through the base ballast resistance R1. The base ballast resistance R1 has the function of suppressing thermal runaway of the first transistor Q1. The first transistor Q1 is, for example, a hetero-junction bipolar transistor.

The power-supply voltage is supplied to a collector of each of the first transistors Q1 through the inductor 49. An emitter of each of the first transistors Q1 is grounded.

The output-stage bias circuit 47 includes a second transistor Q2 functioning as an emitter-follower transistor that applies the base bias voltage to the first transistor Q1. The second transistor Q2 is, for example, a hetero-junction bipolar transistor. An emitter of the second transistor Q2 is connected to the base ballast resistance R1 of each of the first transistors Q1 through a resistance R2. A collector of the second transistor Q2 is connected to the bias voltage input terminal Vbat.

A third transistor Q3 and a fourth transistor Q4 are connected in series to constitute a temperature characteristic compensation circuit S1. The third transistor Q3 and the fourth transistor Q4 are each, for example, a hetero-junction bipolar transistor. In each of the third transistor Q3 and the fourth transistor Q4, a collector and a base are connected to each other. A transistor of which collector and base are connected is called a diode-connected transistor. Each of the diode-connected third transistor Q3 and fourth transistor Q4 functions as a diode. Furthermore, the base of the fourth transistor Q4 and the base of the second transistor Q2 are connected to constitute a current mirror.

The output-stage bias control terminal Vbias2 is connected to the ground through both a resistance R3 and the temperature characteristic compensation circuit S1. The diode-connected third transistor Q3 and fourth transistor Q4 of the temperature characteristic compensation circuit S1 are connected in a forward direction, and a voltage at a point at which the resistance R3 and the temperature characteristic compensation circuit S1 are connected to each other (i.e., a voltage at the base of the fourth transistor Q4) is applied to the base of the second transistor Q2. The base of the second transistor Q2 is connected to the ground through a bypass capacitance C1.

The third transistor Q3 is disposed near the first transistor Q1 as described later with reference to FIG. 3, for example, and it functions as a temperature compensation element under condition of receiving the influence of heat generated by the first transistor Q1. With a temperature rise of the first transistor Q1, the temperature of the third transistor Q3 also rises. As a result, a collector-emitter voltage of the third transistor Q3 drops and a bias voltage supplied to the base of the second transistor Q2 also drops. With a drop of the bias voltage supplied to the base of the second transistor Q2, a bias voltage and current supplied to the base of the first transistor Q1 also drop. Thus, the temperature compensation element constituted by the third transistor Q3 controls, with a temperature rise, the second transistor Q2 to operate in a direction of dropping the bias voltage and current that are supplied to the base of the first transistor Q1. In other words, the third transistor Q3 functioning as the temperature compensation element performs a feedback operation such that, when a collector current increases with the temperature rise of the first transistor Q1, an increase of the collector current is suppressed.

Figure 3:
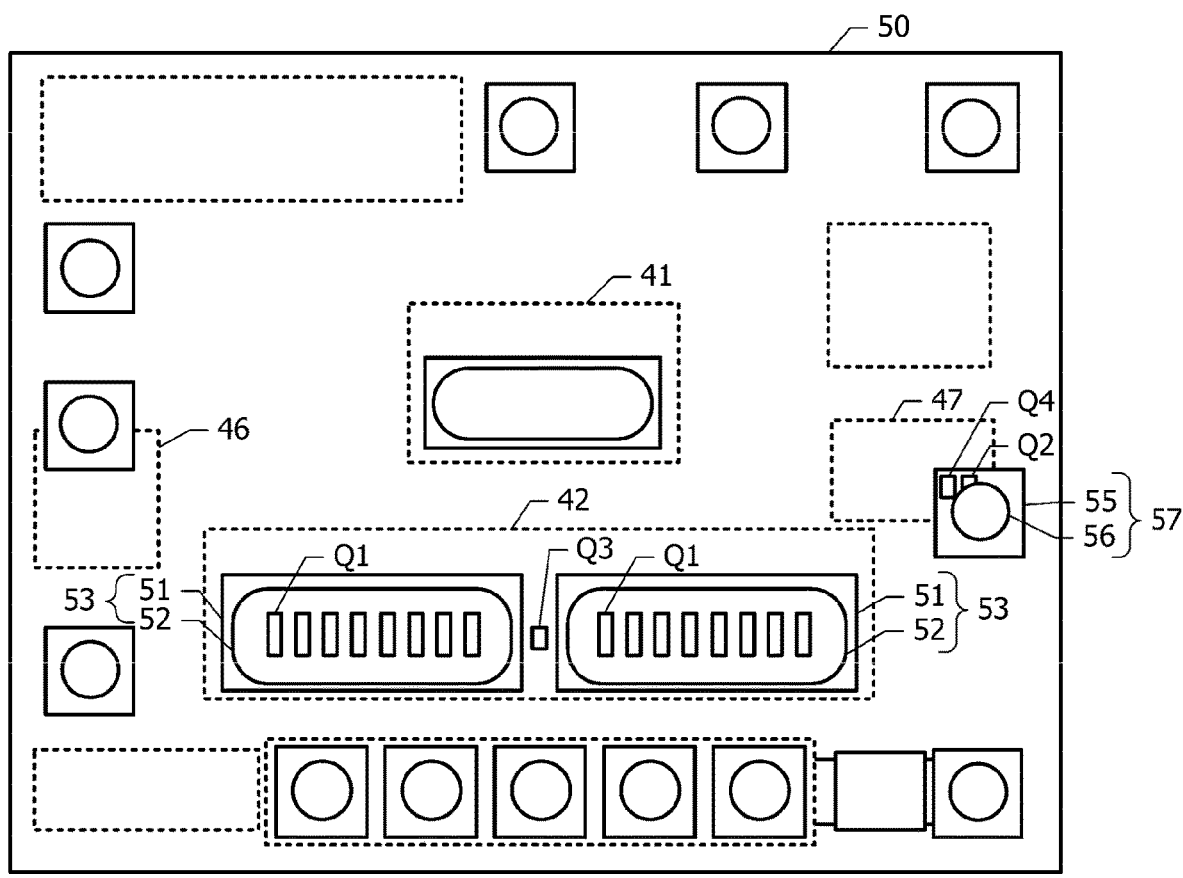
FIG. 3 illustrates a plan layout, on a semiconductor chip, of a plurality of constituent elements of the radio frequency power amplifier according to the first embodiment.

FIG. 3 illustrates a plan layout of constituent elements in the semiconductor chip 50 constituting the radio frequency power amplifier 40 according to the first embodiment. Regions where the first-stage amplifier circuit 41, the output-stage amplifier circuit 42, the first-stage bias circuit 46, the output-stage bias circuit 47, etc. are to be formed are prepared in an upper surface of the semiconductor chip 50. In addition, regions where the matching circuits, protective circuits, external connection terminals, etc. are to be formed are prepared.

The sixteen first transistors Q1 are disposed in the region prepared for the output-stage amplifier circuit 42. Those first transistors Q1 are divided into two groups each including eight first transistors. Two first pads 51 and two first bumps 52 are disposed corresponding to the two groups. In this specification, the first pad 51 and the first bump 52 corresponding to the first pad 51 are collectively called a first external-connection conductive member 53. When viewed in plan, the first transistors Q1 are disposed to be at least partially overlapped with the first external-connection conductive member 53. Here, the wording "a transistor overlaps with a particular member when viewed in plan" implies that at least one of a collector layer, a base layer, and an emitter layer of the transistor overlaps with the particular member when viewed in plan. Furthermore, the wording "partially overlap" implies that at least part of one member partially overlaps with at least part of the other member. For example, the first transistors Q1 are disposed within the contour of both the first pad 51 and the first bump 52 when viewed in plan. The first bump 52 is connected to the first transistors Q1 through the first pad 51.

The second transistor Q2 and the fourth transistor Q4 of the output-stage bias circuit 47 are disposed in the region prepared for the output-stage bias circuit 47. In other words, the second transistor Q2 and the fourth transistor Q4 are disposed at positions not overlapping with the first transistors Q1, namely away from the first transistors Q1. The third transistor Q3 functioning as the temperature compensation element in the output-stage bias circuit 47 is disposed not in the region prepared for the output-stage bias circuit 47, but in the region prepared for the output-stage amplifier circuit 42. Thus, the third transistor Q3 is disposed near the first transistors Q1. More specifically, the third transistor Q3 is disposed between the two groups of the first transistors Q1 to be positioned near the first transistors Q1. The shortest distance between the centers of gravity for the first transistors Q1 and the second transistor Q2 is longer than that between the centers of gravity for the first transistors Q1 and the third transistor Q3.

The definition of the shortest distance between the centers of gravity for the first transistors Q1 and the second transistor Q2 is described here. As described later with reference to FIG. 4, the first transistors Q1 and the second transistor Q2 are each constituted by a collector mesa including at least part of a collector layer, a base mesa including a base layer, and an emitter mesa including an emitter layer. A structure in which the base mesa and the collector mesa are aligned with each other when viewed in plan may also be used in some cases.

The distance from the center of gravity (geometrical center) of the emitter mesa for each of the first transistors Q1 to that of the emitter mesa of the second transistor Q2 when viewed in plan is defined as the distance between the centers of gravity. The shortest one among the distances between the centers of gravity from the first transistors Q1 to the second transistor Q2 is defined as the shortest distance between the centers of gravity for the first transistors Q1 and the second transistor Q2. The shortest distance between the centers of gravity for the first transistors Q1 and the third transistor Q3 is also similarly defined.

A second bump 56 is connected to the second transistor Q2 through a second pad 55. In this specification, the second pad 55 and the second bump 56 corresponding to the second pad 55 are collectively called a second external-connection conductive member 57. The second external-connection conductive member 57 corresponds to the bias voltage input terminal Vbat (FIG. 2). When viewed in plan, the second transistor Q2 and the fourth transistor Q4 are disposed to be at least partially overlapped with the second external-connection conductive member 57. For example, the second transistor Q2 and the fourth transistor Q4 are disposed within the contour of the second pad 55 when viewed in plan.

As described above, the first transistor Q1 and the first pad 51 are constituted in the so-called pad-on-element (POE) structure in which a pad is disposed just above a transistor. Similarly, the second transistor Q2 and the second pad 55 are also constituted in the POE structure. The semiconductor chip 50 constituting the radio frequency power amplifier 40 according to the first embodiment is face-down mounted such that a surface of the semiconductor chip 50 on which the first pump 52 and the second bump 56 are formed is opposed to the module substrate.

Figure 4:
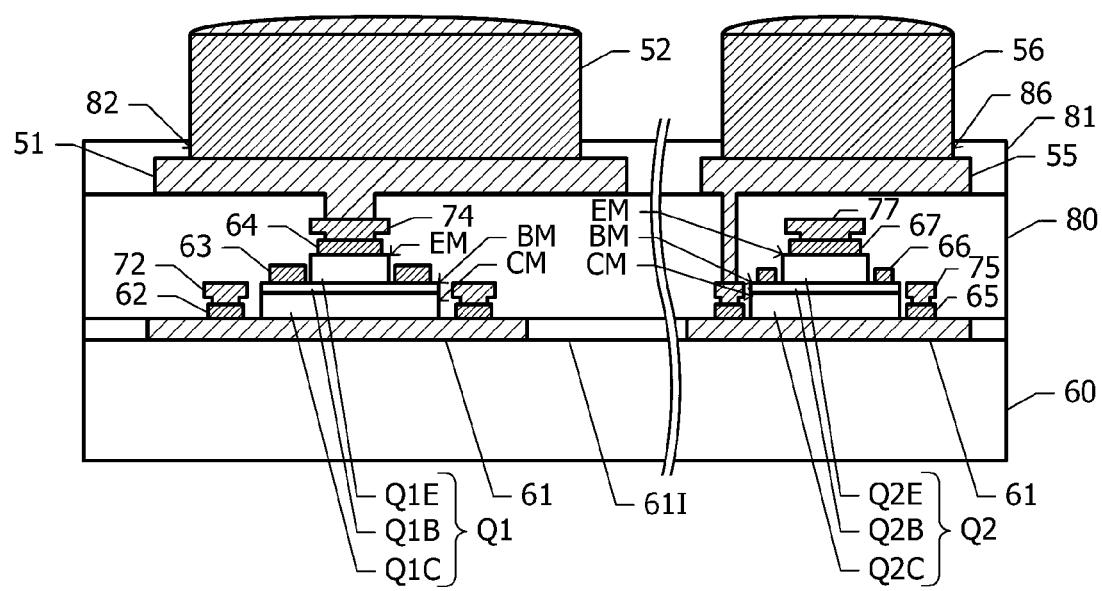
FIG. 4 is a sectional view of a first transistor and a second transistor in the radio frequency power amplifier (FIG. 1) according to the first embodiment.

FIG. 4 is a sectional view of the first transistor Q1 and the second transistor Q2 in the radio frequency power amplifier 40 (FIG. 1) according to the first embodiment. A layer made of n-type GaAs is formed on a substrate 60 made of semi-insulating GaAs. A region 61I occupying part of the above layer is subjected to ion injection to become insulating. A region in the layer made of n-type GaAs, the region being not insulating, is called a sub-collector layer 61. The first transistor Q1 and the second transistor Q2 are each disposed on the sub-collector layer 61. The first transistor Q1 includes a collector layer Q1C, a base layer Q1B, and an emitter layer Q1E. The second transistor Q2 includes a collector layer Q2C, a base layer Q2B, and an emitter layer Q2E. The sub-collector layer 61 on which the first transistor Q1 is disposed and the sub-collector layer 61 on which the second transistor Q2 is disposed are electrically isolated by the insulating region 61I. For example, the collector layers Q1C and Q2C are made of n-type GaAs, the base layers Q1B and Q2B are made of p-type GaAs, and the emitter layers Q1E and Q2E are made of n-type InGaP.

Each of the collector layers Q1C and Q2C constitutes a collector mesa CM having a mesa-like shape, each of the base layers Q1B and Q2B constitutes a base mesa BM having a mesa-like shape, and each of the emitter layers Q1E and Q2E constitutes an emitter mesa EM having a mesa-like shape. FIG. 4 illustrates the case in which the collector mesa CM and the base mesa BM are completely overlapped with each other when viewed in plan. However, a lower surface of the base mesa BM may have a smaller size than an upper surface of the collector mesa CM such that a step-like difference is provided between the upper surface of the collector mesa CM and the upper surface of the base mesa BM.

A collector electrode 62 disposed on the sub-collector layer 61 is ohmic-connected to the collector layer of the first transistor Q1 through the sub-collector layer 61. A base electrode 63 and an emitter electrode 64 are ohmic-connected respectively to the base layer and the emitter layer of the first transistor Q1. Similarly, a collector electrode 65 disposed on the sub-collector layer 61 is ohmic-connected to the collector layer of the second transistor Q2 through the sub-collector layer 61. A base electrode 66 and an emitter electrode 67 are ohmic-connected respectively to the base layer and the emitter layer of the second transistor Q2.

Collector wirings 72 and 75 are disposed respectively on the collector electrodes 62 and 65. Emitter wirings 74 and 77 are disposed respectively on the emitter electrodes 64 and 67. An insulating film 80 is formed to cover those wirings. An insulating film is further disposed between each of the collector electrodes 62 and 65, the emitter electrodes 64 and 67, etc. and the corresponding wiring, but such an insulating film is omitted in FIG. 4.

The first pad 51 and the second pad 55 are disposed on the insulating film 80. The first pad 51 is connected to the emitter wiring 74 through an opening formed in the insulating film 80. The second pad 55 is connected to the collector wiring 75 through another opening formed in the insulating film 80. When viewed in plan, the first pad 51 is disposed to at least partially overlap with the first transistor Q1, and the second pad 55 is disposed to at least partially overlap with the second transistor Q2.

A protective film 81 is disposed on the insulating film 80 to cover the first pad 51 and the second pad 55. Openings 82 and 86 through which partial regions of upper surfaces of the first pad 51 and the second pad 55 are exposed, respectively, are formed in the protective film 81. The first bump 52 is disposed on the first pad 51 exposed through the opening 82, and the second bump 56 is disposed on the second pad 55 exposed through the opening 86. Each of the first bump 52 and the second bump 56 includes a metal pillar made of copper, for example, and a solder layer disposed on an upper surface of the metal pillar.

Advantageous effects of the first embodiment will be described below.

With operation of the output-stage amplifier circuit 42, the temperature of the first transistor Q1 (FIG. 2) rises. Under condition of receiving the influence of a temperature rise of the first transistor Q1, the temperature of the second transistor Q2 also rises, whereupon hFE of the second transistor Q2 lowers and the ability of supplying a base current to the first transistor Q1 reduces. With reduction of the ability of supplying the base current to the first transistor Q1, temperature compensation control cannot be performed in a satisfactory manner. Particularly, in the case of the face-down mounting of the semiconductor chip 50, because a heat dissipation path is limited to the bumps, heat is more apt to accumulate in the substrate 60 (FIG. 4) than the case in which the semiconductor chip 50 is bonded to a heatsink. As a result, the second transistor Q2 is more easily affected by the temperature rise of the first transistor Q1. For example, when the semiconductor chip 50 is bonded to the heatsink and is connected by wire bonding, the temperature of the semiconductor chip 50 at a point other than a heat generating region is about 25° C. In the case of the face-down mounting, however, the temperature of the semiconductor chip 50 at the point other than the heat generating region rises to about 40° C.

In the first embodiment, since the second transistor Q2 and the second pad 55 are constituted in the POE structure, heat resistance of a heat dissipation path extending from the second transistor Q2 through the second pad 55 and the second bump 56 (FIG. 4), namely through the second external-connection conductive member 57, is relatively small. Therefore, the temperature rise of the second transistor Q2 can be suppressed. Thus, even when the temperature of the first transistor Q1 rises, the temperature rise of the second transistor Q2 is suppressed. It is hence possible to suppress the reduction of the ability of supplying the base current to the first transistor Q1.

Simulations conducted to confirm the advantageous effects of the first embodiment will be described below with reference to FIGS. 5A to 5F and 6. Electrical-thermal analysis simulation was conducted on six samples that are different not only in positional relations among the first transistor Q1, the second transistor Q2, a third transistor Q3, and a fourth transistor Q4, and but also in whether the POE structure is applied to the second transistor Q2 or not.

FIGS. 5A to 5F illustrate layouts of the first transistor Q1, the second transistor Q2, the third transistor Q3, and the fourth transistor Q4 and planar positional relations of the second bump 56 with respect to those transistors in the samples that are simulation targets.

In each of the samples illustrated in FIGS. 5A to 5F, the sixteen first transistors Q1 are arrayed in a row along a linear line extending in the vertical direction on the drawing. Assuming that serial numbers 1 to 16 are successively assigned to the sixteen first transistors Q1 starting from an upper end transistor toward a lower end transistor, the first to eighth first transistors Q1 and the ninth to sixteenth first transistors Q1 are arrayed at an equal pitch (40 µm). The center-to-center distance between the eighth first transistor Q1 and the ninth first transistor Q1 is greater than the pitch of the other first transistors Q1. The third transistor Q3 is disposed between the eighth first transistor Q1 and the ninth first transistor Q1.

Figure 5A:
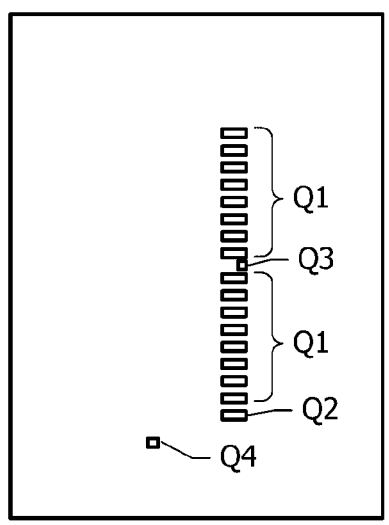
FIGS. 5A to 5F illustrate layouts of the first transistor, the second transistor, a third transistor, and a fourth transistor, and planar positional relations of a second pad with respect to those transistors in samples that are simulation targets.
Figure 5D:
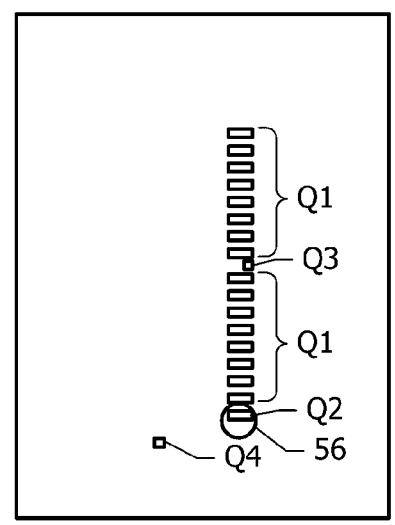

In the samples illustrated in FIGS. 5A and 5D, the second transistor Q2 is disposed on an extension line extending downward from the row of the first transistors Q1, and the center-to-center distance between the sixteenth (lower-end) first transistor Q1 and the second transistor Q2 is 31.4 µm. The fourth transistor Q4 is disposed at a position deviated leftward from the extension line extending downward from the row of the first transistors Q1. The center-to-center distance between the second transistor Q2 at the lower end and the fourth transistor Q4 is about five times the pitch of the first transistors Q1 arrayed at the equal pitch, specifically 190 µm.

Figure 5B:
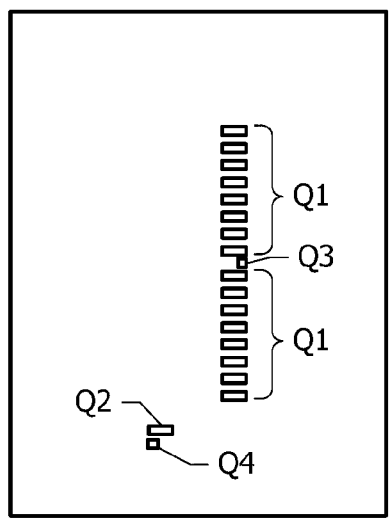
Figure 5E:
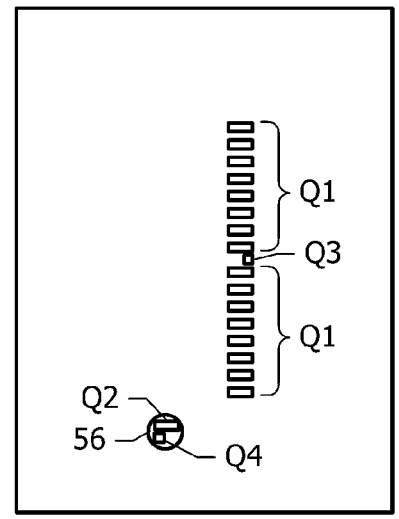

The position of the fourth transistor Q4 in the samples illustrated in FIGS. 5B and 5E is the same as that of the fourth transistor Q4 in the samples illustrated in FIGS. 5A and 5D. In the samples illustrated in FIGS. 5B and 5E, the second transistor Q2 is disposed near the fourth transistor Q4. The center-to-center distance between the second transistor Q2 and the fourth transistor Q4 is 22.8 µm. Thus, in the samples illustrated in FIGS. 5B and 5E, the second transistor Q2 is disposed farther away from the first transistors Q1 than in the samples illustrated in FIGS. 5A and 5D.

Figure 5C:
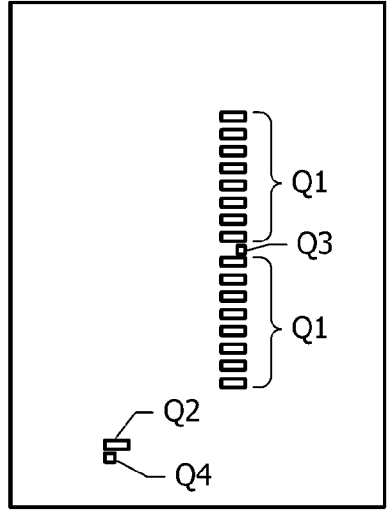
Figure 5F:
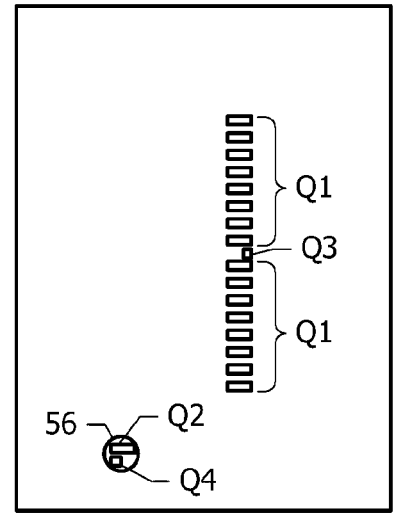

In the samples illustrated in FIGS. 5C and 5F, the second transistor Q2 and the fourth transistor Q4 are disposed farther away from the sixteenth (lower-end) first transistor Q1 than in the samples illustrated in FIGS. 5B and 5E. The distance from the lower-end first transistor Q1 to the second transistor Q2 in the samples illustrated in FIGS. 5C and 5F is about twice that in the samples illustrated in FIGS. 5B and 5E, specifically 375 µm.

In the samples illustrated in FIGS. 5A, 5B and 5C, the POE structure is not applied to the second transistor Q2. In the samples illustrated in FIGS. 5D, 5E and 5F, the POE structure is applied to the second transistor Q2. Thus, the second pad 55 is disposed to overlap with the second transistor Q2.

DC operation of the first transistors Q1 in each of the samples illustrated in FIGS. 5A to 5F was analyzed by simulation. More specifically, on condition that a current incoming from the output-stage bias control terminal Vbias2 was kept constant at 3.6 mA, a collector-emitter voltage Vce was changed and a collector current of the first transistors Q1 was measured when a thermal steady state was reached.

Figure 6:
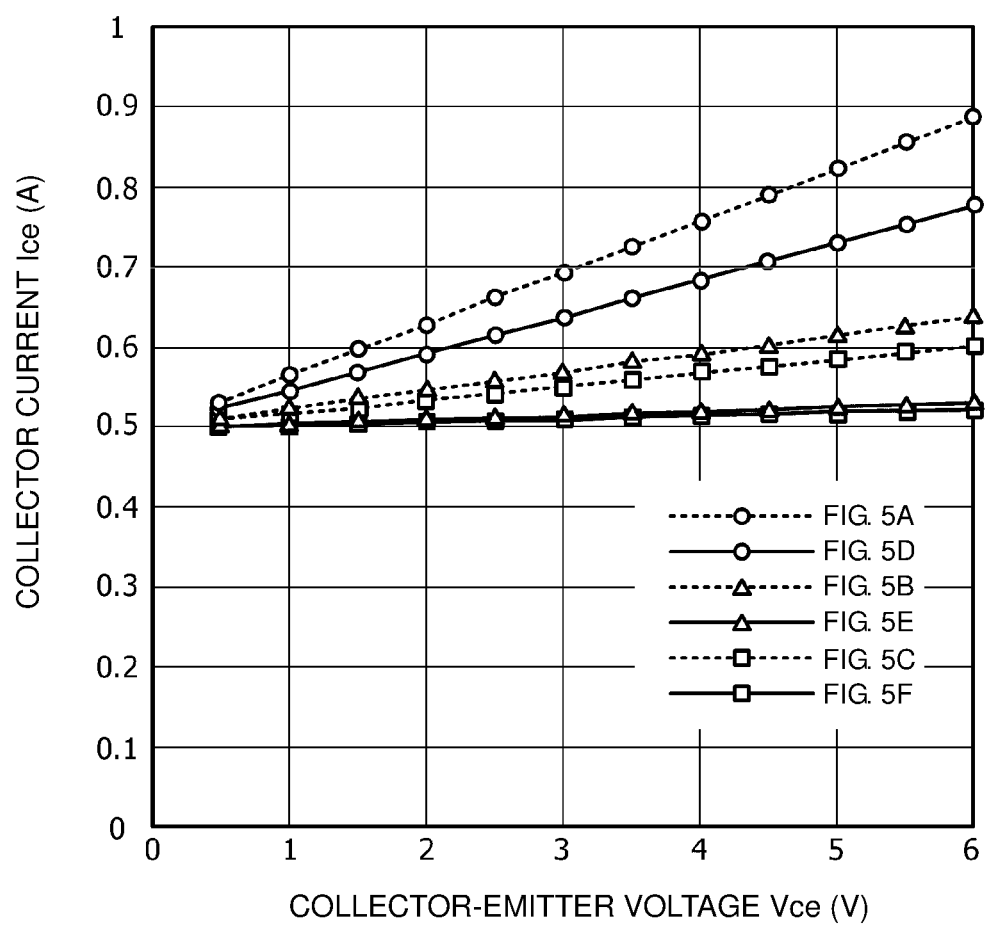
FIG. 6 is a graph depicting simulation results of the samples illustrated in FIGS. 5A to 5F.

FIG. 6 is a graph depicting simulation results of the samples illustrated in FIGS. 5A to 5F. A horizontal axis of FIG. 6 represents the collector-emitter voltage Vce of each first transistor Q1 in unit "V", and a vertical axis represents a total collector current Ice of the sixteen first transistors Q1 in unit "A". The simulation result of the sample illustrated in FIG. 5A is represented by circle marks and a dotted line, the simulation result of the sample illustrated in FIG. 5B is represented by triangular marks and a dotted line, and the simulation result of the sample illustrated in FIG. 5C is represented by square marks and a dotted line. The simulation result of the sample illustrated in FIG. 5D is represented by circle marks and a solid line, the simulation result of the sample illustrated in FIG. 5E is represented by triangular marks and a solid line, and the simulation result of the sample illustrated in FIG. 5F is represented by square marks and a solid line.

Comparing the simulation results of the samples of FIGS. 5A, 5B and 5C, it is understood that, as the second transistor Q2 is positioned closer to the first transistors Q1, the gradient of a graph (hereinafter referred to as a "Vce-Ice curve") representing the relation of the collector current Ice with respect to the collector-emitter voltage Vce increases. The larger gradient of the Vce-Ice curve implies that the operation of the first transistors Q1 is more susceptible to the generated heat.

As seen from the comparison between the sample of FIG. 5A and the sample of FIG. 5D, the comparison between the sample of FIG. 5B and the sample of FIG. 5E, and the comparison between the sample of FIG. 5C and the sample of FIG. 5F, the gradient of the Vce-Ice curve reduces by applying the POE structure to the second transistor Q2. This is because the heat dissipation characteristics of the second transistor Q2 are improved and the temperature rise of the second transistor Q2 is suppressed.

Comparing the simulation results of the samples of FIGS. 5B, 5C and 5E, the following findings are obtained. The effect of reducing the gradient of the Vce-Ice curve is higher when the POE structure is applied to the second transistor Q2 without changing the distance from the first transistors Q1 to the second transistor Q2 than when the second transistor Q2 is positioned farther away from the first transistors Q1. This is presumably attributable to the fact that, because heat is more apt to accumulate in the substrate in the case of the face-down mounting, the effect of reducing the thermal influence of the first transistors Q1 upon the second transistor Q2 is relatively low even when the second transistor Q2 is positioned farther away from the first transistors Q1. In the case of the face-down mounting, particularly, the effect of suppressing the temperature rise of the second transistor Q2 is increased by applying the POE structure to the second transistor Q2.

A modification of the first embodiment will be described below.

In the first embodiment, the third transistor Q3 (FIG. 3) is disposed between the two groups each constituted by the eight first transistors Q1. However, the third transistor Q3 may be disposed near the first transistors Q1 other than between the two groups. Here, the word "near" implies such a short distance that the third transistor Q3 is thermally affected by the temperature rise of the first transistors Q1.

A practical example of the layout of the third transistor Q3 disposed near the first transistors Q1 will be described below. If any wiring not directly connected to the first transistors Q1 and the third transistor Q3 and any other electronic element are disposed between the third transistor Q3 and the first transistors Q1 when viewed in plan, the spacing between the third transistor Q3 and the first transistors Q1 has to be widened depending on the sizes of the wiring and the electronic element disposed therebetween. From the viewpoint of disposing the third transistor Q3 at such a short distance from the first transistors Q1 that the third transistor Q3 is thermally affected by the first transistors Q1, it is preferable to design the layout in which any wiring not directly connected to the first transistors Q1 and the third transistor Q3 and any other electronic element are not disposed between both the transistors.

For example, preferably, a line segment connecting the first transistor Q1 and the third transistor Q3 at the shortest distance does not intersect, when viewed in plan, any wiring not directly connected to the first transistors Q1 and the third transistor Q3 and any other electronic element. Here, the wording "line segment connecting two transistors when viewed in plan" implies a line segment connecting any one among a collector layer, a base layer, and an emitter layer of one of the two transistors to any one among a collector layer, a base layer, and an emitter layer of the other transistor.

The number of line segments connecting the first transistor Q1 and the third transistor Q3 at the shortest distance when viewed in plan is not limited to one. For example, when each of the first transistor Q1 and the third transistor Q3 has a rectangular shape in a plan view and sides of two rectangles defined by both the transistors are positioned parallel to each other in an opposing relation, there are infinite line segments connecting both the transistors at the shortest distance when viewed in plan.

While, in the first embodiment, the third transistor Q3 (FIGS. 2 and 3) is used as the temperature compensation element, the fourth transistor Q4 may be used as the temperature compensation element instead of the third transistor Q3. In that case, it is just required that the fourth transistor Q4 is disposed near the first transistors Q1 whereas the third transistor Q3 is disposed away from the first transistors Q1. Alternatively, the third transistor Q3 and the fourth transistor Q4 may be both used as the temperature compensation elements. In that case, it is just required that the third transistor Q3 and the fourth transistor Q4 are both disposed near the first transistors Q1.

Preferably, the POE structure is further applied to other circuit elements (bias elements) in the output-stage bias circuit 47 than the third transistor Q3 that is used as the temperature compensation element. Stated in another way, the fourth transistor Q4, the bypass capacitance C1, and the resistance R3 are also preferably constituted in the POE structure. This is contributable to suppressing a temperature rise in each of those bias elements. As a result, advantageous effects are obtained in that the output-stage bias circuit 47 is less susceptible to the heat generated from the first transistors Q1 and the operation is stabilized. The POE structure may be constituted such that the above-mentioned bias elements of the output-stage bias circuit 47 are disposed to partially overlap with the second pad 55 when viewed in plan.

While, in the first embodiment, the GaAs/InGaP-based hetero-junction bipolar transistor is used as the first transistor Q1, a hetero-junction bipolar transistor made of another compound semiconductor may be used instead.

In the first embodiment, the first pad 51 and the first bump 52 constitute the first external-connection conductive member 53, and the second pad 55 and the second bump 56 constitute the second external-connection conductive member 57. However, the first external-connection conductive member 53 may be constituted only by the first bump 52 without disposing the first pad 51. Similarly, the second external-connection conductive member 57 may be constituted only by the second bump 56 without disposing the second pad 55.

Another modification of the first embodiment will be described below with reference to FIG. 7.

Figure 7:
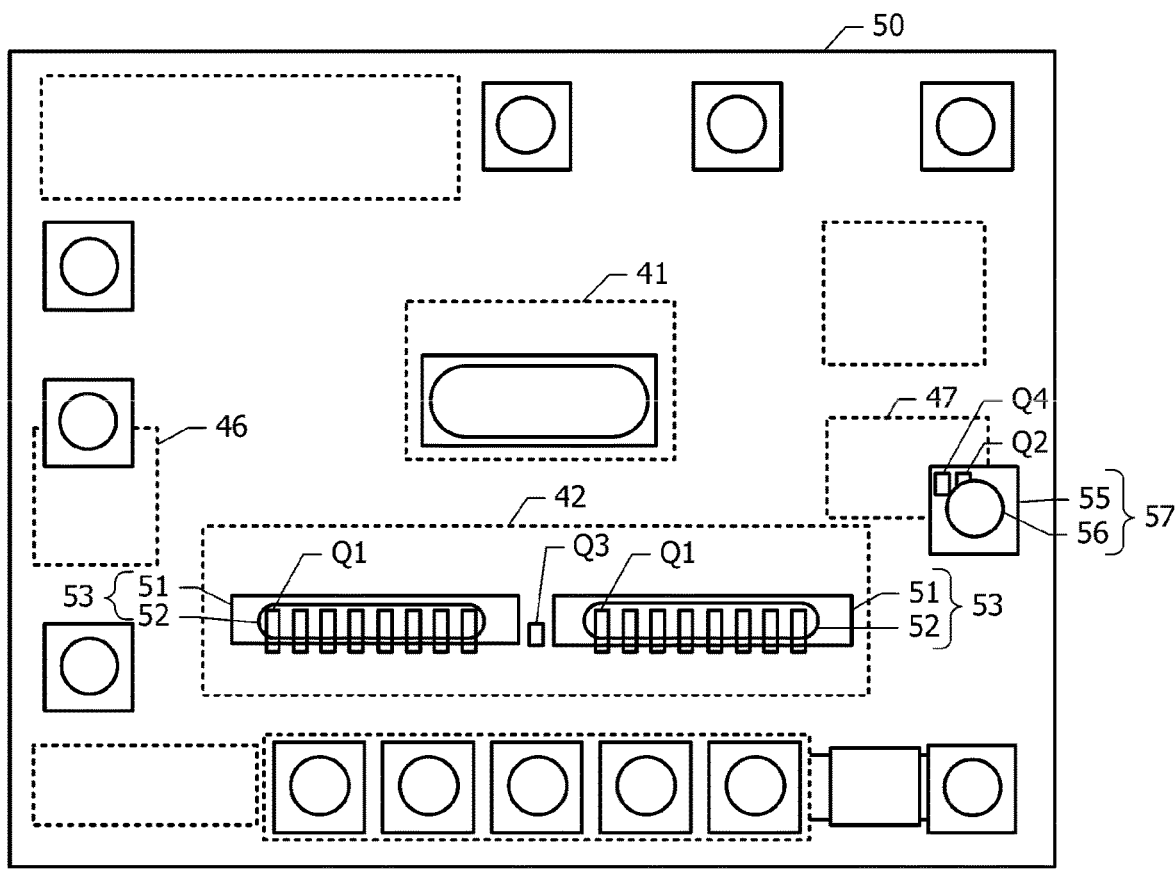
FIG. 7 illustrates a plan layout, on a semiconductor chip, of a plurality of constituent elements of a radio frequency power amplifier according to a modification of the first embodiment.

FIG. 7 illustrates a plan layout of individual constituent elements in a semiconductor chip 50 constituting a radio frequency power amplifier 40 according to this modification. In the first embodiment (FIG. 3), the first transistors Q1 are positioned within the contour of the first external-connection conductive member 53 when viewed in plan. On the other hand, in this modification, part of each of the first transistors Q1 projects outward of the contour of the first external-connection conductive member 53 when viewed in plan. Thus, the first external-connection conductive member 53 may be disposed to partially overlap with the first transistors Q1 when viewed in plan.

While, in the first embodiment, the first external-connection conductive member 53 (FIG. 3) connected to the emitter of the first transistor Q1 is disposed to overlap with the first transistor Q1 when viewed in plan, an external-connection conductive member connected to the collector of the first transistor Q1 may be disposed to overlap with the first transistor Q1 when viewed in plan.

While, in the first embodiment, the hetero-junction bipolar transistor is used as the first transistor Q1, a field effect transistor may be used instead. In that case, the first external-connection conductive member 53 is preferably connected to a drain of the first transistor Q1. The second transistor Q2 is preferably constituted to apply the bias voltage to a gate of the first transistor Q1.

An external-connection conductive member connected to a source of the first transistor Q1, which is the field effect transistor, may be disposed to overlap with the first transistor Q1 when viewed in plan.

Second Embodiment

A radio frequency power amplifier according to a second embodiment will be described below with reference to FIG. 8. In the following, description of constituent elements common to those of the radio frequency power amplifier (FIGS. 1, 2, 3 and 4) according to the first embodiment is omitted.

Figure 8:
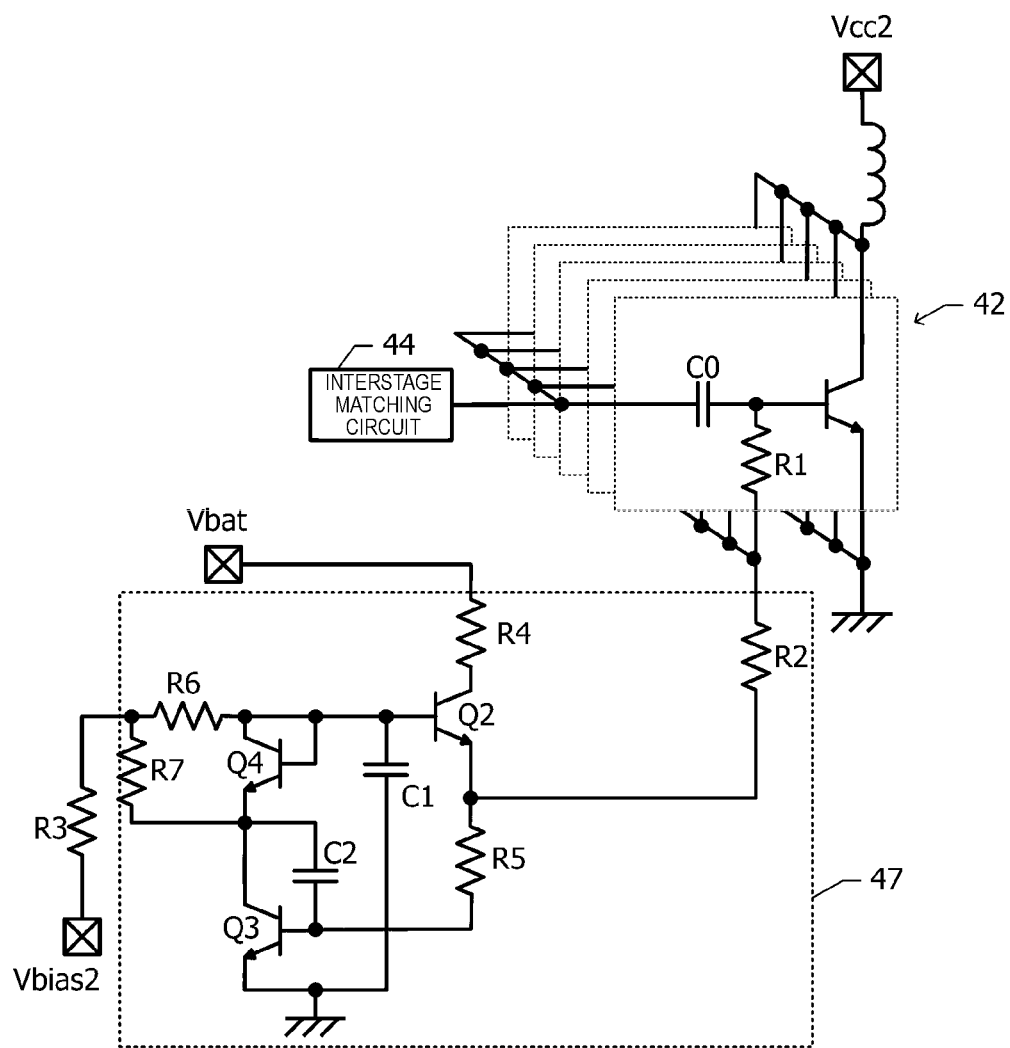
FIG. 8 is an equivalent circuit diagram of an output-stage amplifier circuit and an output-stage bias circuit in a radio frequency power amplifier according to a second embodiment.

FIG. 8 is an equivalent circuit diagram of an output-stage amplifier circuit 42 and an output-stage bias circuit 47 in the radio frequency power amplifier according to the second embodiment. In the second embodiment, a resistance R4 is disposed between the bias voltage input terminal Vbat and the collector of the second transistor Q2. The emitter of the second transistor Q2 is connected to the base of the third transistor Q3 through a resistance R5. The base bias voltage is supplied to each first transistor Q1 and the third transistor Q3 from the second transistor Q2. A capacitance C2 is disposed between the base and the collector of the third transistor Q3.

Furthermore, the collector of the fourth transistor Q4 is connected to the output-stage bias control terminal Vbias2 through resistances R6 and R3. Moreover, the collector of the third transistor Q3 and the emitter of the fourth transistor Q4 are connected to the output-stage bias control terminal Vbias2 through resistances R7 and R3.

Also in the second embodiment, the third transistor Q3 functions as the temperature compensation element. Thus, as in the first embodiment, the third transistor Q3 is disposed near the first transistors Q1. In addition, as in the first embodiment, the second transistor Q2 is disposed away from the first transistors Q1, and the POE structure is applied to the second transistor Q2. With that layout, the second embodiment can also provide similar advantageous effects to those obtained in the first embodiment.

Third Embodiment

A radio frequency power amplifier according to a third embodiment will be described below with reference to FIG. 9. In the following, description of constituent elements common to those of the radio frequency power amplifier (FIG. 8) according to the second embodiment is omitted.

Figure 9:
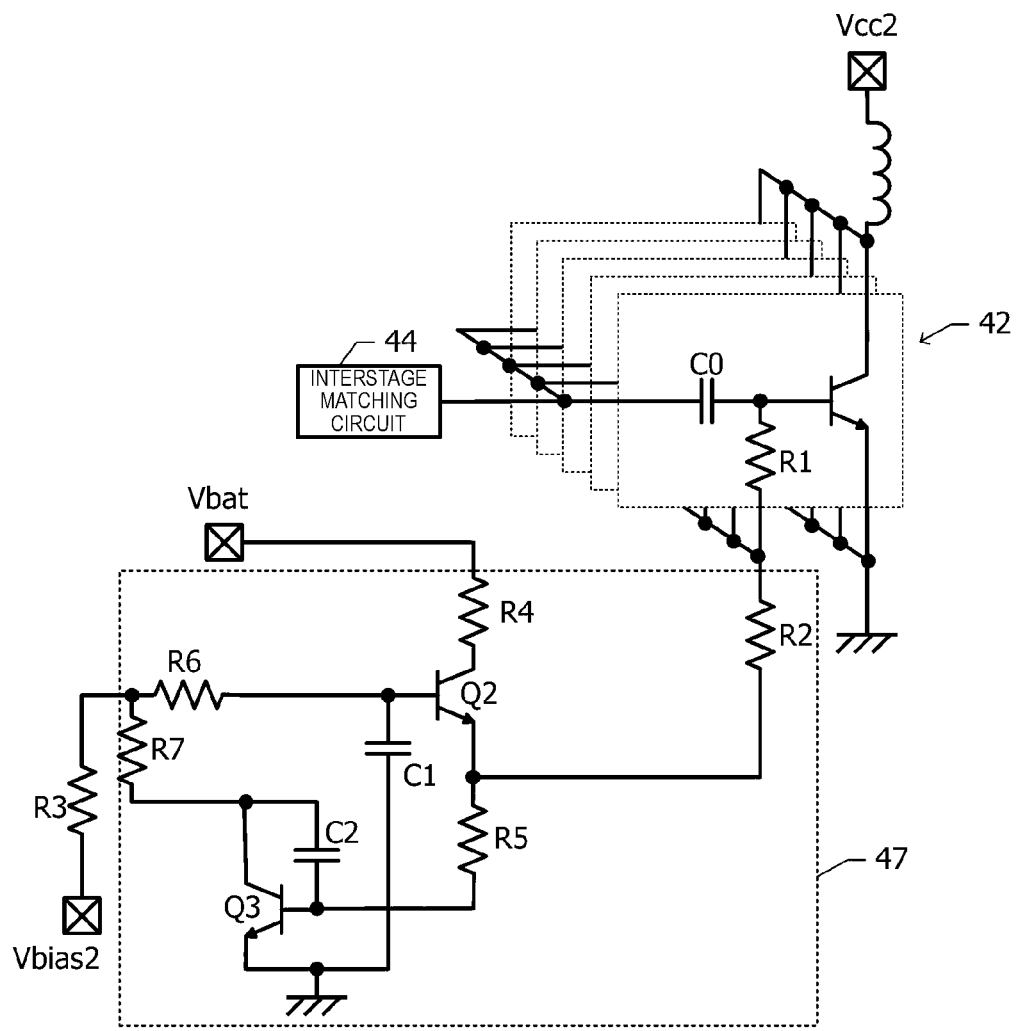
FIG. 9 is an equivalent circuit diagram of an output-stage amplifier circuit and an output-stage bias circuit in a radio frequency power amplifier according to a third embodiment.
Figure 10A:
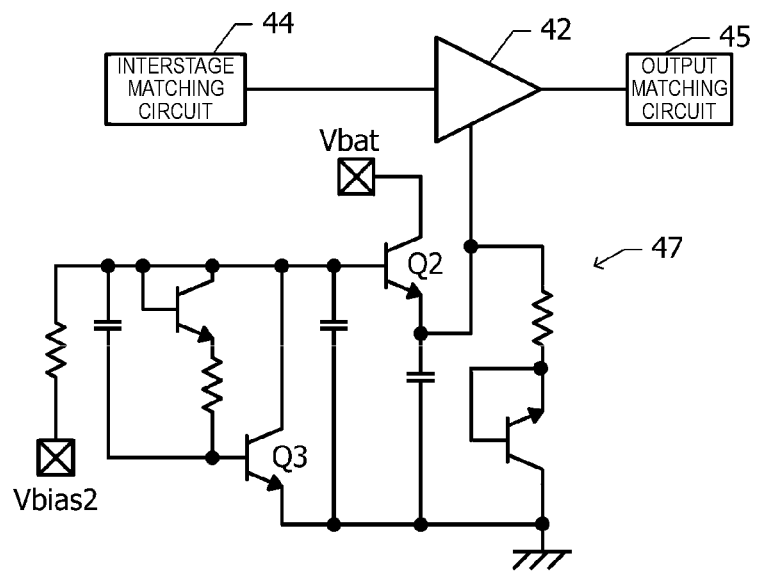
FIGS. 10A, 10B and 10C are equivalent circuit diagrams of output-stage amplifier circuits and output-stage bias circuits in radio frequency power amplifiers according to modifications of the third embodiment.
Figure 10B:
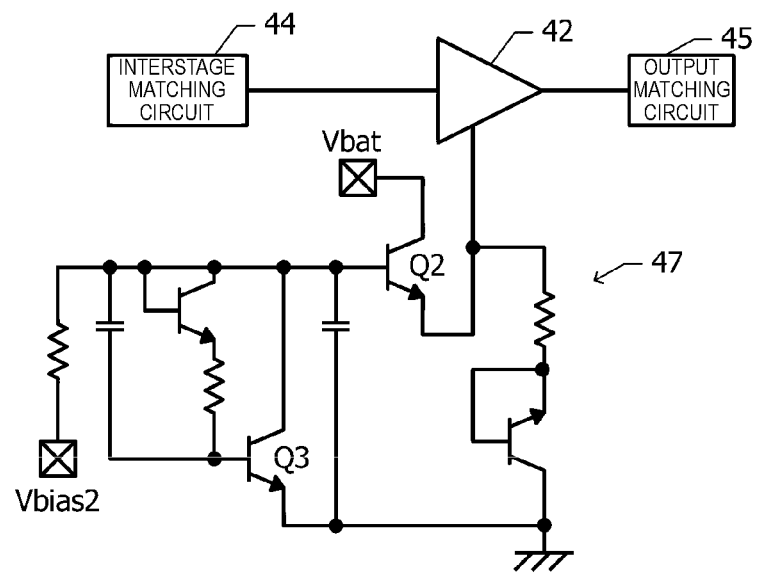
Figure 10C:
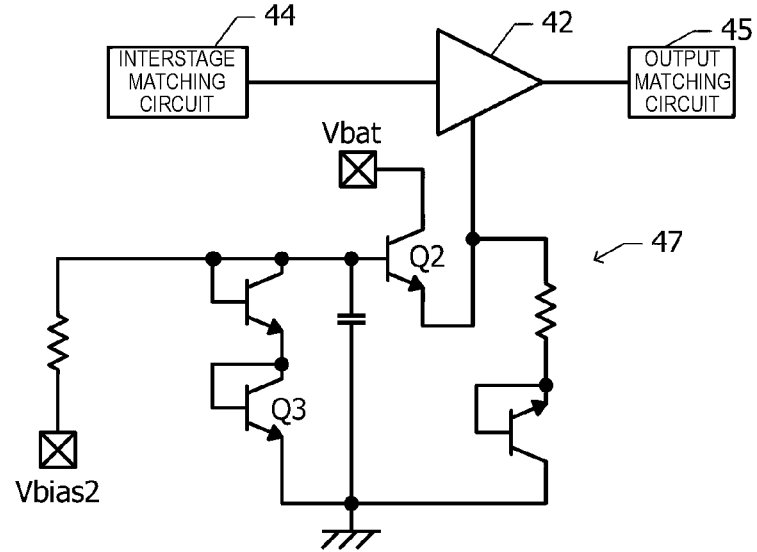
Figure 11A:
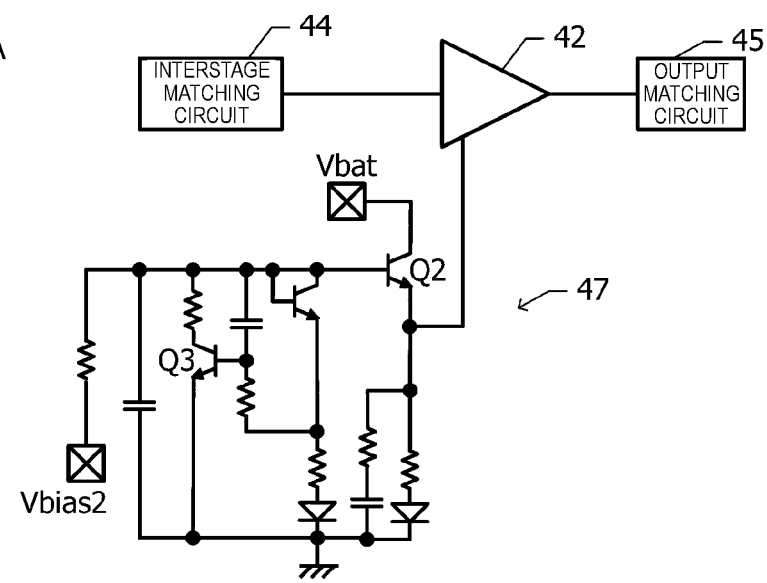
FIGS. 11A, 11B and 11C are equivalent circuit diagrams of output-stage amplifier circuits and output-stage bias circuits in radio frequency power amplifiers according to other modifications of the third embodiment.
Figure 11B:
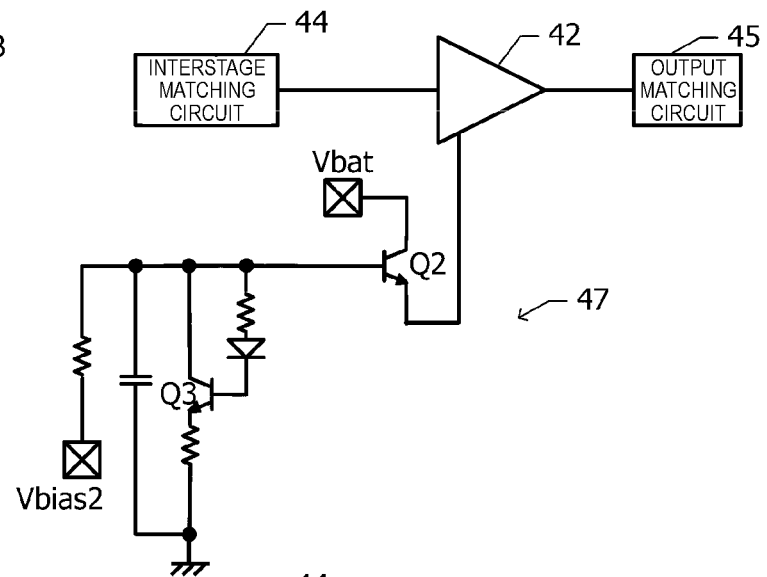
Figure 11C:
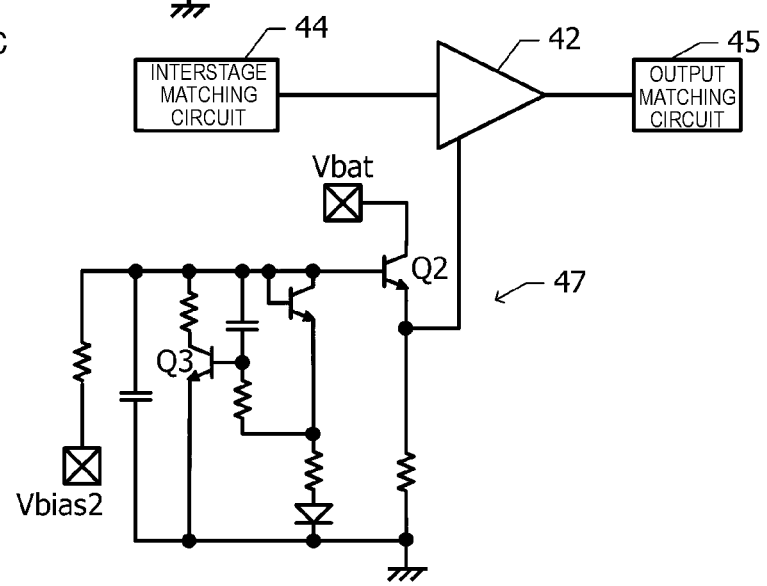

FIG. 9 is an equivalent circuit diagram of an output-stage amplifier circuit 42 and an output-stage bias circuit 47 in the radio frequency power amplifier according to the third embodiment. The output-stage bias circuit 47 in the third embodiment has the same configuration as that of the output-stage bias circuit 47 in the second embodiment except for excluding the fourth transistor Q4 (FIG. 8). Also in the third embodiment, the third transistor Q3 functions as the temperature compensation element. In addition, the third embodiment can also provide similar advantageous effects to those obtained in the second embodiment.

Output-stage bias circuits 47 in radio frequency power amplifiers according to modifications of the third embodiment will be described below with reference to FIGS. 10A to 10C, 11A to 11C, and 12.

FIGS. 10A to 10C, 11A to 11C, and 12 are equivalent circuit diagrams of the output-stage amplifier circuits 47 in the radio frequency power amplifiers according to the modifications of the third embodiment.

Each of the output-stage bias circuits 47, illustrated in FIGS. 10A to 10C and FIGS. 11A to 11C according to the modifications, includes the second transistor Q2 functioning as an emitter-follower transistor that applies the bias voltage to the base of the first transistor Q1 (FIG. 2), as in the first, second, and third embodiments. Furthermore, each of the output-stage bias circuits 47 includes the third transistor Q3 functioning as the temperature compensation element.

Figure 12:
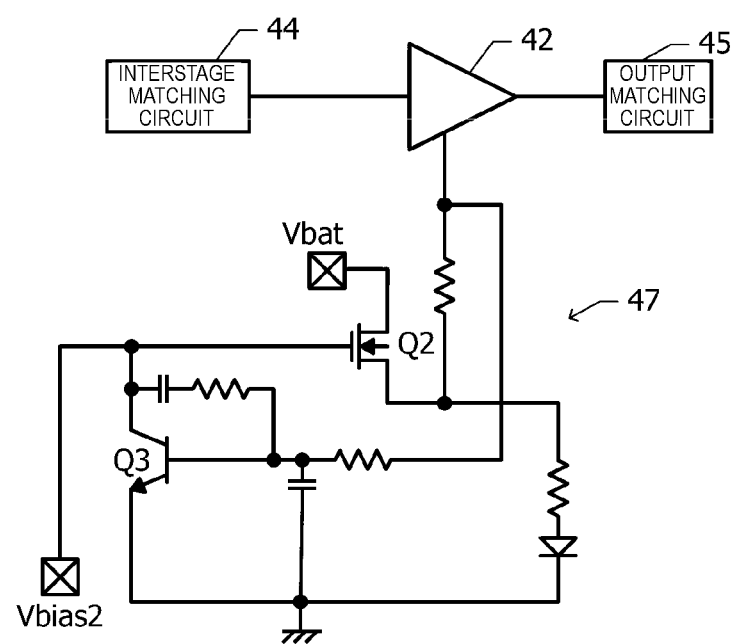
FIG. 12 is an equivalent circuit diagram of an output-stage amplifier circuit and an output-stage bias circuit in a radio frequency power amplifier according to still another modification of the third embodiment.

The output-stage bias circuit 47 according to the modification illustrated in FIG. 12 is a bias circuit in the case of using a field effect transistor (FET) as the transistor for amplification in the output-stage amplifier circuit 42. The output-stage bias circuit 47 according to this modification includes the second transistor Q2 constituted by an FET, and the third transistor Q3 constituted by a bipolar transistor. The second transistor Q2 functions as a source-follower transistor that applies the bias voltage to a gate of the FET in the output-stage amplifier circuit 42. The third transistor Q3 functions as the temperature compensation element.

Fourth Embodiment

A power amplifier module according to a fourth embodiment will be described below with reference to FIG. 13. In the following, description of constituent elements common to those of the radio frequency power amplifier (FIGS. 1, 2, 3 and 4) according to the first embodiment is omitted.

Figure 13:
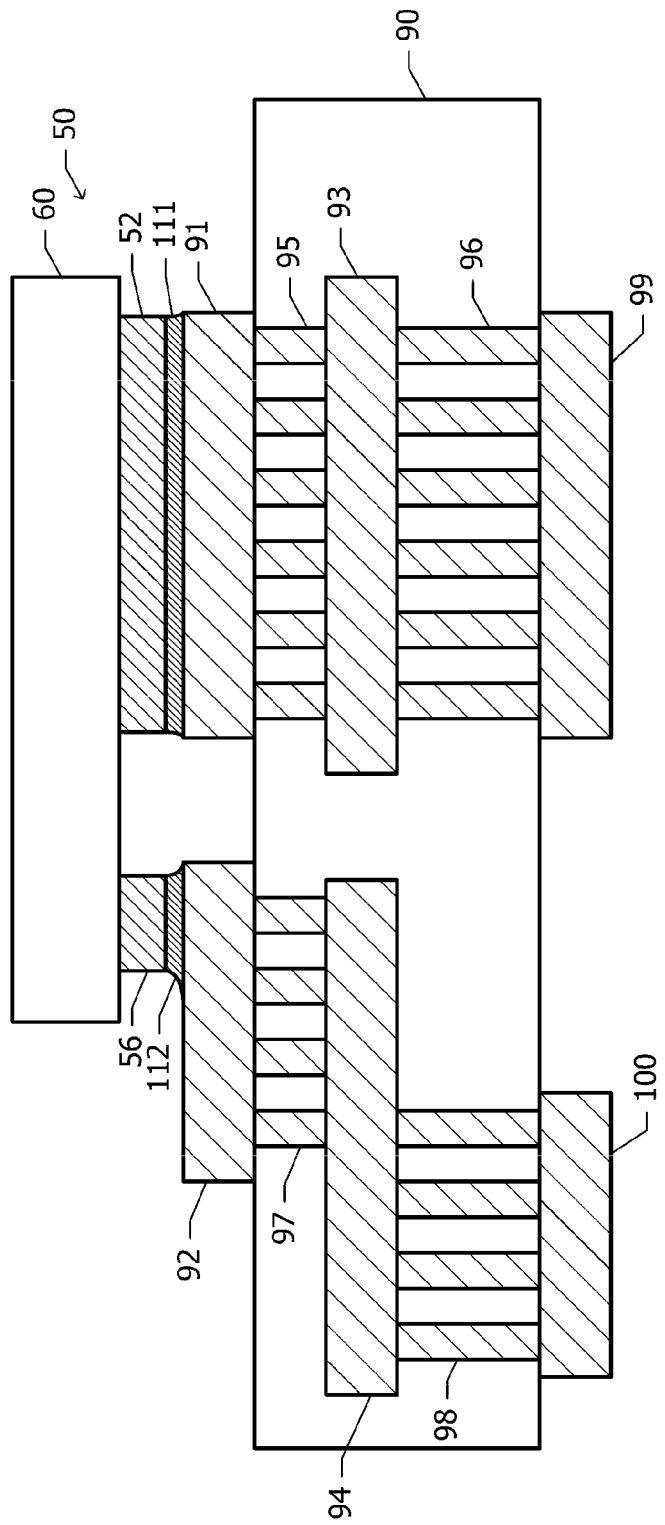
FIG. 13 is a sectional view of a power amplifier module according to a fourth embodiment.

FIG. 13 is a sectional view of the power amplifier module according to the fourth embodiment. The power amplifier module according to the fourth embodiment includes a module substrate 90 and a semiconductor chip 50. The semiconductor chip 50 in the radio frequency power amplifier according to any of the first to third embodiments is used as the semiconductor chip 50 in this embodiment. The semiconductor chip 50 is face-down mounted to the module substrate 90. The module substrate 90 includes a dielectric portion made of a dielectric material.

A first land 91 and a second land 92 are disposed on one surface of the module substrate 90, and a third land 99 and a fourth land 100 are disposed on the other surface. The first land 91 and the second land 92 are opposed to a first bump 52 and a second bump 56 of the semiconductor chip 50, respectively. The first bump 52 and the first land 91 are mechanically and electrically connected to each other by a solder 111. The second bump 56 and the second land 92 are mechanically and electrically connected to each other by a solder 112. The third land 99 and the fourth land 100 are used for mounting of the module substrate 90 to a mother board, for example.

A first conductor pattern 93 and a second conductor pattern 94 are disposed as inner layers within the dielectric portion of the module substrate 90. The first land 91 and the first conductor pattern 93 are connected to each other by a plurality of via conductors 95, and the first conductor pattern 93 and the third land 99 are connected to each other by a plurality of via conductors 96. Similarly, the second land 92 and the second conductor pattern 94 are connected to each other by a plurality of via conductors 97, and the second conductor pattern 94 and the fourth land 100 are connected to each other by a plurality of via conductors 98.

The heat generated from the first transistors Q1 (FIGS. 3 and 4) of the semiconductor chip 50 is conducted to the mother board, etc. through the first bump 52, the solder 111, the first land 91, the via conductors 95, the first conductor pattern 93, the via conductors 96, and the third land 99. The heat generated from the second transistors Q2 (FIGS. 3 and 4) of the semiconductor chip 50 is conducted to the mother board, etc. through the second bump 56, the solder 112, the second land 92, the via conductors 97, the second conductor pattern 94, the via conductors 98, and the fourth land 100. The via conductors 95, 96, 97 and 98, the first conductor pattern 93, and the second conductor pattern 94 constitute a heat flow path for heat dissipation from the semiconductor chip 50. Accordingly, the via conductors 95, 96, 97 and 98, the first conductor pattern 93, and the second conductor pattern 94 can be called heat dissipation patterns.

From the viewpoint of causing those heat dissipation patterns to function as the heat flow paths, the heat flow paths are preferably formed to have sufficient cross-sectional areas. For example, it is preferable that, when viewed in plan, the first conductor pattern 93 has a size and a shape containing the contour of the first land 91 and the second conductor pattern 94 has a size and a shape containing the contour of the second land 92. Here, the wording "a size and a shape containing the contour of the first land 91" does not implies only the case in which the first land 91 is disposed at a position where the first land 91 is contained within the contour of the first conductor pattern 93 when viewed in plan. Even in the case in which the first land 91 can be made contained within the contour of the first conductor pattern 93 by translating the first land in parallel to an in-plane direction, it can be said that the first conductor pattern 93 has a size and a shape containing the contour of the first land 91.

Furthermore, from the viewpoint of increasing the cross-sectional area of the heat flow path between one land and the conductor pattern as the inner layer, it is preferable to dispose a plurality of via conductors for connection therebetween. In the case in which the plurality of via conductors are disposed for the connection between one land and one conductor pattern as the inner layer, those via conductors can also be called heat dissipation patterns.

A modification of the fourth embodiment will be described below. While, in the fourth embodiment (FIG. 13), the first conductor pattern 93 is disposed between the via conductors 95 and the via conductors 96, the via conductors 95 may be extended up to the third land 99 without disposing the first conductor pattern 93. In that configuration, the first land 91 and the third land 99 are connected to each other by the plurality of via conductors 95.

A communication device may be constituted by combining the power amplifier module according to the fourth embodiment with an antenna element, a diplexer, etc.

As a matter of course, the above embodiments are merely illustrative and the features described in the different embodiments can be partially replaced or combined with each other. Similar advantageous effects obtained in the different embodiments are not repeatedly described for each of the embodiments. The present disclosure is not limited to the above embodiments. It is apparent to those skilled in the art that the present disclosure can be implemented with various changes, improvements, combinations, etc.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A radio frequency power amplifier including a semiconductor chip, the semiconductor chip comprising:
at least one first transistor amplifying a radio frequency signal;
a first external-connection conductive member connected to the first transistor;
a bias circuit including a second transistor that applies a bias voltage to the first transistor; and
a second external-connection conductive member connected to the second transistor,
wherein the second external-connection conductive member at least partially overlaps with the second transistor when viewed in plan.

2. The radio frequency power amplifier according to claim 1, wherein
the bias circuit further includes a temperature compensation element controlling the second transistor that reduces the bias voltage, which is applied to the first transistor, with a temperature rise, and
a shortest distance from the first transistor to the second transistor is longer than a shortest distance from the first transistor to the temperature compensation element.

3. The radio frequency power amplifier according to claim 2, wherein
the bias circuit further includes, in addition to the second transistor and the temperature compensation element, a bias element that is at least one of a resistance, a capacitance, and a transistor, and
the bias element does not overlap with the first external-connection conductive member and overlaps with the second external-connection conductive member or another external-connection conductive member when viewed in plan.

4. The radio frequency power amplifier according to claim 2, wherein
the at least one first transistor is a plurality of the first transistors disposed on the semiconductor chip, the plurality of the first transistors are divided into at least two groups, the first external-connection conductive member is disposed for each of the at least two groups, and
the temperature compensation element is disposed between the first transistor belonging to one of the at least two groups and the first transistor belonging to the other group.

5. The radio frequency power amplifier according to claim 1, wherein
the first transistor is a hetero-junction bipolar transistor, the first external-connection conductive member is connected to an emitter or a collector of the first transistor, and
the second transistor applies a voltage to a base or the collector of the first transistor.

6. The radio frequency power amplifier according to claim 1, wherein
the first transistor is a field effect transistor,
the first external-connection conductive member is connected to a drain or a source of the first transistor, and
the second transistor applies a voltage to a gate or the drain of the first transistor.

7. The radio frequency power amplifier according to claim 1, wherein the first transistor is contained within a contour of the first external-connection conductive member when viewed in plan.

8. The radio frequency power amplifier according to claim 3, wherein
the at least one first transistor is a plurality of the first transistors disposed on the semiconductor chip, the plurality of the first transistors are divided into at least two groups, the first external-connection conductive member is disposed for each of the at least two groups, and
the temperature compensation element is disposed between the first transistor belonging to one of the at least two groups and the first transistor belonging to the other group.

9. The radio frequency power amplifier according to claim 2, wherein
the first transistor is a hetero-junction bipolar transistor, the first external-connection conductive member is connected to an emitter or a collector of the first transistor, and
the second transistor applies a voltage to a base or the collector of the first transistor.

10. The radio frequency power amplifier according to claim 2, wherein
the first transistor is a field effect transistor,
the first external-connection conductive member is connected to a drain or a source of the first transistor, and
the second transistor applies a voltage to a gate or the drain of the first transistor.

11. A power amplifier module comprising:
a semiconductor chip; and
a module substrate onto which the semiconductor chip is mounted,
the semiconductor chip comprising:
at least one first transistor amplifying a radio frequency signal;
a first external-connection conductive member connected to the first transistor;
a bias circuit including a second transistor that applies a bias voltage to the first transistor; and
a second external-connection conductive member connected to the second transistor,
wherein
the second external-connection conductive member at least partially overlaps with
the second transistor when viewed in plan, and
the module substrate comprises:
a dielectric portion made of a dielectric material;
a first land and a second land that are opposed respectively to the first external-connection conductive member and the second external-connection conductive member and that are connected respectively to the first external-connection conductive member and the second external-connection conductive member; and
a conductor pattern disposed as an inner layer in the dielectric portion, connected to the second land, and having a size and a shape containing a contour of the second land when viewed in plan.

12. The power amplifier module according to claim 11, wherein
the bias circuit further includes a temperature compensation element controlling the second transistor that reduces the bias voltage, which is applied to the first transistor, with a temperature rise, and
a shortest distance from the first transistor to the second transistor is longer than a shortest distance from the first transistor to the temperature compensation element.

13. The power amplifier module according to claim 12, wherein
the bias circuit further includes, in addition to the second transistor and the temperature compensation element, a bias element that is at least one of a resistance, a capacitance, and a transistor, and
the bias element does not overlap with the first external-connection conductive member and overlaps with the second external-connection conductive member or another external-connection conductive member when viewed in plan.

14. The power amplifier module according to claim 12, wherein
the at least one first transistor is a plurality of the first transistors disposed on the semiconductor chip, the first transistors are divided into at least two groups,
the first external-connection conductive member is disposed for each of the at least two groups, and
the temperature compensation element is disposed between the first transistor belonging to one of the at least two groups and the first transistors belonging to the other group.

15. The power amplifier module according to claim 11, wherein the first transistor is a hetero-junction bipolar transistor,
the first external-connection conductive member is connected to an emitter or a collector of the first transistor, and
the second transistor applies a voltage to a base or the collector of the first transistor.

16. The power amplifier module according to claim 11, wherein the first transistor is a field effect transistor, the first external-connection conductive member is connected to a drain or a source of the first transistor, and the second transistor applies a voltage to a gate or the drain of the first transistor.

17. The power amplifier module according to claim 11, wherein the first transistor is contained within a contour of the first external-connection conductive member when viewed in plan.

18. The power amplifier module according to claim 13, wherein
the at least one first transistor is a plurality of the first transistors disposed on the semiconductor chip, the first transistors are divided into at least two groups,
the first external-connection conductive member is disposed for each of the at least two groups, and
the temperature compensation element is disposed between the first transistor belonging to one of the at least two groups and the first transistors belonging to the other group.

19. The power amplifier module according to claim 12, wherein
the first transistor is a hetero-junction bipolar transistor,
the first external-connection conductive member is connected to an emitter or a collector of the first transistor, and
the second transistor applies a voltage to a base or the collector of the first transistor.

20. The power amplifier module according to claim 12, wherein the first transistor is a field effect transistor, the first external-connection conductive member is connected to a drain or a source of the first transistor, and the second transistor applies a voltage to a gate or the drain of the first transistor.

* * * * *